(12) United States Patent
Kaneda et al.

(10) Patent No.: US 6,452,416 B1
(45) Date of Patent: Sep. 17, 2002

(54) ABNORMALITY DETECTING APPARATUS FOR A ROTATING ELECTRIC MACHINE

(75) Inventors: Yoshiharu Kaneda; Takao Tsurimoto; Nobuo Urakawa, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/575,526

(22) Filed: May 22, 2000

(30) Foreign Application Priority Data

May 24, 1999 (JP) .......................................... 11-143605

(51) Int. Cl.$^7$ .............................................. G01R 31/34
(52) U.S. Cl. ..................... 324/772; 219/69.18; 702/189
(58) Field of Search ................................ 324/544, 551, 324/546, 771, 772, 536, 547, 557, 553; 318/767, 768; 702/189; 219/69.18

(56) References Cited

U.S. PATENT DOCUMENTS

| | | | |
|---|---|---|---|
| 4,152,640 A | * | 5/1979 | Craig |
| 5,155,441 A | * | 10/1992 | Zelm |
| 5,406,185 A | * | 4/1995 | Strunk |
| 5,680,059 A | | 10/1997 | Shiota et al. ................ 324/772 |
| 5,828,227 A | | 10/1998 | Shiota et al. ................ 324/772 |
| 6,242,883 B1 | * | 6/2001 | Strunk |

FOREIGN PATENT DOCUMENTS

JP    7-234257    9/1995

OTHER PUBLICATIONS

Stone et al., Development Of An Automatic Continuous On–Line Partial Discharge Monitor For Generators, $4^{th}$ CEA/EPRI International Conference, May 1996, pp. 1–12.

Stone et al., "Practical Implementation Of Ultrawideband Partial Discharge Detectors", IEEE Transactions on Electrical Insulation, vol. 27, No. 1, Feb. 1992, pp. 70–81.

* cited by examiner

*Primary Examiner*—Michael J. Sherry
*Assistant Examiner*—Trung Nguyen
(74) *Attorney, Agent, or Firm*—Leydig, Voit, & Mayer, Ltd.

(57) ABSTRACT

An abnormality detecting apparatus in which noise is rejected in determining the condition of each of rotating electrical machines, so that a partial discharge of a rotating electric machine is detected with high accuracy. The abnormality detecting apparatus includes partial discharge detectors for detecting a partial discharge of a rotating electrical machine, a switching unit for selecting a partial discharge detector, a partial discharge measurement section for measuring the signal from the selected switch, a computer for selecting the respective partial discharge detectors or sequentially selecting respective partial discharge detectors for measurement, noise rejection, insulation diagnosis judgement, and data management for the respective discharge detectors, and for displaying measurement results, and a control section for controlling the switching unit and the partial discharge measurement section through the computer.

14 Claims, 9 Drawing Sheets

FIG. 5

TABLE 1 COMBINATION OF DETECTION NO., DETECTOR, AND DETECTION FREQUENCY

| DETECTION NO | ELECTRIC MOTOR | DETECTORS | SENSORS | FIRST FILTER DETECTION FREQUENCY (MHz) | SECOND FILTER DETECTION FREQUENCY (MHz) | NOISE REJECTION CONSTANT (DEGREE) |
|---|---|---|---|---|---|---|
| 1 | ELECTRIC MOTOR A | FIRST PARTIAL DISCHARGE DETECTORS | PARTIAL DISCHARGE SENSOR 61a | 10 | 18 | 11 |
| 2 | | | PARTIAL DISCHARGE SENSOR 61b | 10 | 15 | 10 |
| 3 | | | PARTIAL DISCHARGE SENSOR 61c | 10 | 20 | 13 |
| 4 | | SECOND PARTIAL DISCHARGE DETECTORS | U-PHASE COUPLING CAPACITOR 65b | 15 | 23 | 9 |
| 5 | | | V-PHASE COUPLING CAPACITOR 65b | 14 | 20 | 8 |
| 6 | | | W-PHASE COUPLING CAPACITOR 65b | 14 | 23 | 10 |

FIG. 6

TABLE 2

| DETECTION NO | ELECTRIC MOTOR | DETECTORS | SENSORS | FIRST FILTER DETECTION FREQUENCY (MHz) | SECOND FILTER DETECTION FREQUENCY (MHz) | NOISE REJECTION CONSTANT (DEGREE) |
|---|---|---|---|---|---|---|
| 1 | ELECTRIC MOTOR B | FIRST PARTIAL DISCHARGE DETECTION MEANS | PARTIAL DISCHARGE SENSOR 61a | 10 | 18 | 11 |
| 2 | | | PARTIAL DISCHARGE SENSOR 61b | 10 | 15 | 10 |
| 3 | | | PARTICAL DISCHARGE SENSOR 61c | 10 | 20 | 13 |
| 4 | | SECOND PARTIAL DISCHARGE DETECTION MEANS | U-PHASE COUPLING CAPACITOR 65b | 15 | 23 | 9 |
| 5 | | | V-PHASE COUPLING CAPASITOR 65b | 14 | 20 | 8 |
| 6 | | | W-PHASE COUPLING CAPACITOR 65b | 14 | 23 | 10 |
| 7 | ELECTRIC MOTOR C | FIRST PARTIAL DISCHARGE DETECTORS | PARTIAL DISCHARGE SENSOR 61a | 10 | 16 | 10 |
| 8 | | | PARTIAL DISCHARGE SENSOR 61b | 9 | 16 | 11 |
| 9 | | | PARTICAL DISCHARGE SENSOR 61c | 11 | 16 | 12 |
| 10 | | SECOND PARTIAL DISCHARGE DETECTORS | U-PHASE COUPLING CAPACITOR 65b | 16 | 23 | 10 |
| 11 | | | V-PHASE COUPLING CAPACITOR 65b | 16 | 22 | 10 |
| 12 | | | W-PHASE COUPLING CAPACITOR 65b | 16 | 24 | 9 |
| 13 | ELECTRIC MOTOR A | FIRST PARTIAL DISCHARGE DETECTORS | PARTIAL DISCHARGE SENSOR 61a | 12 | 20 | 12 |
| 14 | | | PARTIAL DISCHARGE SENSOR 61b | 12 | 22 | 13 |
| 15 | | | PARTIAL DISCHARGE SENSOR 61c | 12 | 18 | 12 |
| 16 | | SECOND PARTIAL DISCHARGE DETECTORS | U-PHASE COUPLING CAPACITOR 65b | 25 | 35 | 9 |
| 17 | | | V-PHASE COUPLING CAPACITOR 65b | 25 | 33 | 9 |
| 18 | | | W-PHASE COUPLING CAPACITOR 65b | 25 | 30 | 8 |

ABNORMALITY DETECTING APPARATUS FOR A ROTATING ELECTRIC MACHINE

BACKGROUND OF THE INVENTION

1. Field of the Invention

The present invention relates to an apparatus for measuring a partial discharge, and particularly to an apparatus for detecting a partial discharge when a high voltage rotating electric machine is out of operation or is in operation.

2. Description of the Related Art

In recent years, the size and number of a rotating electric machines are increasing with the increasing scale of plants in general industry, and thus, due to high reliability required for such an electric apparatus, it is necessary to perform maintenance and inspection in a reliable manner so as to prevent an abrupt accident, such as breakdown, from occurring.

Besides, with the greater part of many apparatuses manufactured in the high level economic growth period, 25 years or more have elapsed since their manufacture, and particularly in these electric apparatuses which have worked for a long period, a request for continuous monitoring during the operation becomes very high for the purpose of preventing an abrupt accident from occurring.

Moreover, the Electric Utility Industry Law in Japan or similar laws in other countries was revised on 1996 or will be revised in the future, so that regulations were or will be relieved so that an attempt at voluntary maintenance is strengthened, and an attempt to extend an interval between periodic inspections to a length of about 1.5 times the conventional interval has been carried out, so as to improve management efficiency. From such a point of view, it recently becomes more important to monitor an insulation state during the operation than in the past, and as a monitoring item, importance comes to be attached to a continuous monitoring technique of a partial discharge indicating insulation properties. In a rotating electric machine, when deterioration such as a crack or peeling occurs in an insulating layer of a stator winding by operational stress, a partial discharge is generated at the deteriorated portion by voltage during operation. The deteriorated state of insulation is comprehended by measuring the partial discharge. In general, since the partial discharge of the rotating electric machine or the like is buried in noise, it is necessary to distinguish the partial discharge from the noise so as to measure only the partial discharge. The noise during the operation is the greatest factor among others to make the measurement of the partial discharge difficult.

Many methods have been used for distinguishing a partial discharge from noise and measuring only the discharge of a deteriorated portion when insulation deterioration occurs.

For example, Japanese Patent laid-Open No. Hei. 3-12574 discloses that a partial discharge at the time of starting a rotating electric machine and a partial discharge at the time of a regular operation are respectively measured, and a difference between them is compared. Besides, there is disclosed an abnormality detecting method in which a command is issued so that a partial discharge during a starting period of a rotating electric machine is input to an appropriate device, which then measures the partial discharge quantity during this period and saves the result of this measurement. Then, the partial discharge at the time of the regular operation is measured, so that the saved partial discharge quantity at the time of starting and the partial discharge quantity at the time of the regular operation are compared with each other to find a difference therebetween.

Moreover, for example, Japanese Patent Laid-Open No. Hei. 1-116463 discloses a partial discharge measuring apparatus for a rotating electric machine, which is provided at a predetermined position of a lead for driving the rotating electric machine or outputting power generated thereby, so that a voltage wave and a current wave in a propagation wave of a partial discharge and noise propagating through the lead are detected to determine their polarities, whereby the travelling direction of the propagation wave in the lead is determined from a combination of the thus determined polarities of the voltage wave and current wave, and the partial discharge and the noise are discriminated from each other to detect only the partial discharge.

Besides, computer-aided methods are conventionally used as an insulation diagnosis method for detecting abnormality of insulation. Japanese Patent Laid-Open No. Hei. 3-238370 discloses such a partial discharge diagnosis method in which in the partial discharge measurement of gas insulation equipment, a neural network is made to previously learn a number of partial discharge waveform patterns and their generation factors, so that a partial discharge waveform detected from the gas insulation equipment is classified into a pattern, and a feature of the extracted partial discharge waveform is inputted to the neural network for analyzing a generation factor of the partial discharge.

Moreover, Japanese Patent Laid-Open No. Hei. 1-191071 discloses a monitoring method for a rotating electric machine, in which a high frequency electric quantity based on a discharge extracted from an electric power supply line of the rotating electric machine is attenuated, before measurement thereof, to a level suitable for detection by a detector through an attenuator in which the relation between an operation amount at the time of performing an attenuation operation of a high frequency electric quantity corresponding to a definite discharge quantity and an attenuated output is confirmed in advance, and then, actual measurement is made.

Besides, in the Electric Society Technical Report Second Part No. 402, there are reported insulation diagnosis methods for other various power plants in operation, or partial discharge measurement methods and apparatuses.

As a typical example of such conventional techniques, FIG. 7 shows an example of insulation abnormality detection for a rotating electric machine, and the structure and operation of this conventional technique will be described with reference to FIG. 7.

FIG. 7 is a structural view explaining an abnormality detecting method for a rotating electric machine disclosed in Japanese Patent Laid-Open No. Hei. 3-12574. In FIG. 7, reference numeral 1 designates a three-phase electric motor, and three-phase lines 3 are connected to windings U, V, and W of the respective phases of a stator 2. Solid capacitors 4 having little loss at high frequencies are connected as coupling capacitors to the lines 3. A detector 5, a changeover switch 6, a noise filter 7, and a partial discharge measuring portion 8 are connected to the solid capacitors 4. The partial discharge measuring portion 8 is constituted by a partial discharge measurement portion 9 for measuring a partial discharge at the time of starting the electric motor 1 and a partial discharge in a regular operation thereof, a discharge input time control portion 10 for controlling a partial discharge input time, and a discharge data storage portion 11 for storing discharge data.

A method of determining a deteriorated state by the thus structured conventional abnormality detecting method will be described. In the foregoing structure, it is assumed that there is a relation, as shown in FIG. 8, between the time from the start of the electric motor 1 to the regular operation and load current. From this relation, first, at the time of the start designated by reference numeral 11, a partial discharge is measured by the partial discharge measuring portion 8 through the solid capacitors 4. In this case, from FIG. 8, the start time 11 is as short as 12 seconds (even in a large machine, the time is 30 seconds), inputting of the partial discharge in the start period is instructed by the discharge input time control portion 10, the partial discharge in this period is measured, and a measurement result is stored in the discharge data storage portion 11, so that a partial discharge quantity at the start time is secured.

Next, the motor proceeds to a regular operation designated by reference numeral 12. In this case, the output in the regular operation is changed according to the purpose of use, and reference numeral 121 designates an operation of 30% output; 122, an operation of 60% output; and 123, an operation of 100% output. The partial discharge is measured by the partial discharge measuring portion 8 through the solid capacitors 4 in the state of the operation 123 of 100% output. Then, the difference between the partial discharge quantity at the start time stored in the discharge data storage portion 11 and the partial discharge quantity at the time of the regular operation is compared, and from this result, deterioration in the windings of the stator 2 of the electric motor 1 is judged. The judgement of the winding deterioration is based on the measurement result shown in FIGS. 8 and 9. FIG. 8 shows the relation between the time and load current, and FIG. 9 shows the maximum discharge electric charge quantity at the start time and the regular operation time. When insulation deterioration or fixing force deterioration occurs in the winding of the electric motor 1, as shown by a characteristic 131 of FIG. 9, the difference in the maximum discharge electric charge quantity between the start time and the regular operation time remarkably appears. In the case where the insulation deterioration or fixing force deterioration does not occur in the winding, as shown by characteristics 132 and 133 of FIG. 9, there is little difference in the maximum discharge electric charge quantity between the start time and the regular operation time. In this way, winding abnormality is judged.

In a partial discharge measuring method and measuring apparatus during operation, the most serious problem is to distinguish a partial discharge from noise and to reject it. Besides, in view of improvements in economical efficiency, reduction of costs in maintenance of a rotating electric machine is greatly demanded. With respect to a high voltage electric motor in a power plant or the like, which is an object to be measured in the present invention, a large number of electric motors are operated at the same time. Thus, noise due to operation other than the motor to be measured (hereinafter referred to as a measurement objective motor) is very remarkable, and partial discharges generated in the motors other than the measurement objective motor are also noise. As described above, a problem to be solved is to effectively measure a partial discharge in a large number of rotating electric machines at low cost and after rejecting noise under a noise rejection condition according to respective rotating electric machines, and to perform abnormality monitoring of the rotating electric machine.

In the foregoing conventional abnormality detecting method of the rotating electric machine, as disclosed in Japanese Patent Laid-Open No. Hei. 3-12574, the partial discharge at the time of start of the rotating electric machine and the partial discharge at the time of regular operation are respectively measured and compared with each other to find a difference therebetween. Besides, inputting of the partial discharge during the start period of the rotating electric machine is instructed, so that the partial discharge quantity during this period is measured and the result of this measurement is stored. Then, the partial discharge at the time of regular operation is measured, and the stored partial discharge quantity at the time of start and the partial discharge quantity at the time of regular operation are compared with each other to find a difference therebetween. However, in this prior art, a specific method of noise rejection techniques is not definitely disclosed.

With respect to noise rejection techniques, there is a method disclosed in Japanese Patent Laid-Open No. Hei. 1-116463. In the structure of a measurement apparatus disclosed herein, signals are judged and are measured, and an obtained signal represents a partial discharge. Thus, in order to reject noises of a number of partial discharge sensor signals of a number of rotating electric machines, the structure of the measurement apparatus becomes large, which is contrary to reduction in costs.

Besides, when the technique disclosed in Japanese Patent Laid-Open No. Hei. 3-12574 is considered in view of reduction in costs, although FIG. 5 of this reference shows a changeover switch 7, there is no description thereof. That is, noise rejection and reduction in costs are not taken into consideration.

Besides, for noise rejection techniques, insulation diagnosis and insulation monitoring of a number of apparatuses, it is indispensable to use a calculator. The foregoing Japanese Patent Laid-Open No. Hei. 3-238370 discloses a partial discharge diagnosis method in which in the partial discharge measurement of a gas insulation apparatus, a neural network is used instead of diagnosis heretofore carried out by an expert having a rich knowledge as to partial discharge, and diagnosis is possible for not only a well-known partial discharge waveform but also an unknown partial discharge waveform, and automating is possible. However, there is no technical concept that noises are rejected from a number of rotating electric machines under respective noise rejection conditions, and data management is made.

SUMMARY OF THE INVENTION

The present invention is intended to solve the foregoing problems, and an object of the invention is to provide an abnormality detecting apparatus for a rotating electric machine in which one partial discharge measurement element is used to arbitrarily select signals of a plurality of partial discharge detectors provided respectively to a plurality of rotating electric machines, and noise rejection according to various noise rejection conditions is carried out from the signal by using software, so that partial discharge of the plurality of rotating electric machines can be detected with high accuracy.

According to one aspect of the invention, an abnormality detecting apparatus for a rotating electric machine for measuring a partial discharge generated by abnormality of the rotating electric machine, comprises a plurality of partial discharge detectors for detecting a partial discharge of the rotating electric machine; a switching unit for selecting one arbitrary signal from the plurality of partial discharge detectors; a partial discharge measurement element for measuring a signal of the selected partial discharge detector; a computer for arbitrarily selecting one of the plurality of partial discharge detectors or sequentially selecting the plurality of partial discharge detectors, for carrying out measurement, noise rejection, insulation diagnosis judgement, and data management for the respective partial discharge detectors in accordance with a measurement condition, a judgement condition, and a management condition previously determined for the respective partial discharge detectors, and for displaying a measurement result; and a controller for controlling the switching unit and the partial discharge measurement element from the computer.

According to another aspect of the invention, an abnormality detecting apparatus for a rotating electric machine for measuring a partial discharge generated by abnormality of the rotating electric machine, comprises a plurality of partial discharge detectors for detecting a partial discharge of the rotating electric machine; a switching unit for selecting three arbitrary signals from the plurality of partial discharge detectors; a partial discharge measurement element for measuring the selected three signals of the partial discharge detectors; a computer for arbitrarily selecting three of the plurality of partial discharge detectors or sequentially selecting three of the plurality of partial discharge detectors, for carrying out measurement, noise rejection, insulation diagnosis judgement, and data management for respective partial discharge detectors in accordance with a measurement condition, a judgement condition, and a management condition previously determined for the respective partial discharge detectors, and for displaying a measurement result; and a controller for controlling the switching unit and the partial discharge measurement element from the computer.

In a preferred form of the invention, the plurality of partial discharge detectors comprise a plurality of first partial discharge detectors set inside of a frame of the rotating electric machine.

In another preferred form of the invention, the plurality of partial discharge detectors comprises a plurality of second partial discharge detectors set at high voltage buses of the rotating electric machine.

According to still another aspect of the invention, an abnormality detecting apparatus for a rotating electric machine for measuring a partial discharge generated by abnormality of the rotating electric machine, comprises a plurality of first partial discharge detectors set inside of frames of a plurality of rotating electric machines; a plurality of second partial discharge detectors set at high voltage buses of the plurality of rotating electric machines; a switching unit for selecting one arbitrary signal from the plurality of first partial discharge detectors and one arbitrary signal from the plurality of second partial discharge detectors; a partial discharge measurement element for measuring the selected signals of the first and second partial discharge detectors; a computer for arbitrarily selecting one of the plurality of first partial discharge detectors and one of the plurality of second partial discharge detectors or sequentially selecting the first partial discharge detectors and the second partial discharge detectors, for carrying out measurement, noise rejection, insulation diagnosis judgement, and data management for the first partial discharge detectors and for the second partial discharge detectors in accordance with a measurement condition, a judgement condition, and a management condition previously determined for the first partial discharge detectors and those for the second partial discharge detectors, and for displaying measurement results; and a controller for controlling the switching unit and the partial discharge measurement element from the computer.

Preferably, the partial discharge measurement element comprises a first narrow band detection circuit and a second narrow band detection circuit in which propagation characteristics of a signal is taken into consideration, and the partial discharge is discriminated and measured through a comparison between a first narrow band signal and a second narrow band signal.

Preferably, a detection band of the first narrow band detection circuit and the second narrow band detection circuit is 5 to 50MHz, and the comparison between the first narrow band signal and the second narrow band signal is a signal intensity comparison.

Preferably, the plurality of first partial discharge detectors set inside of the frames of the rotating electric machines are temperature detection elements and lead lines.

Preferably, the plurality of first partial discharge detectors set inside of the frames of the rotating electric machines are antennas, a center frequency of an electromagnetic wave detected by the first narrow band detection circuit and the second narrow band detection circuit constituting the partial discharge measurement element is within a range of 300 MHz to 3 GHz, and the comparison between the first narrow band signal and the second narrow band signal is a signal intensity comparison.

Preferably, the plurality of second partial discharge detectors set at the high voltage buses of the rotating electric machines are coupling capacitors and detection elements.

Moreover, in the apparatus, in accordance with previously programmed contents, each of the partial discharge detectors is arbitrarily selected for measuring a partial discharge in a measurement frequency band set for each of the partial discharge detectors, so that the partial discharge is discriminated by a comparison between the first narrow band signal and the second narrow band signal for each of the partial discharge detectors to reject the noise, whereby insulation diagnosis judgement is made and data management is made for each of partial discharge measurement portions.

Preferably, noise is discriminated and rejected from the partial discharge through a difference in reaching time to the first partial discharge detectors and the second partial discharge detectors, so that insulation diagnosis judgement is made and data management is made for each of partial discharge measurement portions.

Preferably, the output signal intensity of the first partial discharge detectors is compared with the output signal intensity of the second partial discharge detectors so that noise is discriminated and rejected from the partial discharge, and thereafter insulation diagnosis judgement is made and data management is made for each of partial discharge measurement portions.

BRIEF DESCRIPTION OF THE DRAWINGS

In the accompanying drawings:

FIG. 5 is a table showing the combination of detectors of the first embodiment of the invention and detection frequencies;

FIG. 6 is a table showing the combination of detectors of the second embodiment of the invention and detection frequencies;

DETAILED DESCRIPTION OF THE PREFERRED EMBODIMENTS

Preferred embodiments of the present invention will be described below with reference to the accompanying drawings.

Embodiment 1

Figure 1:
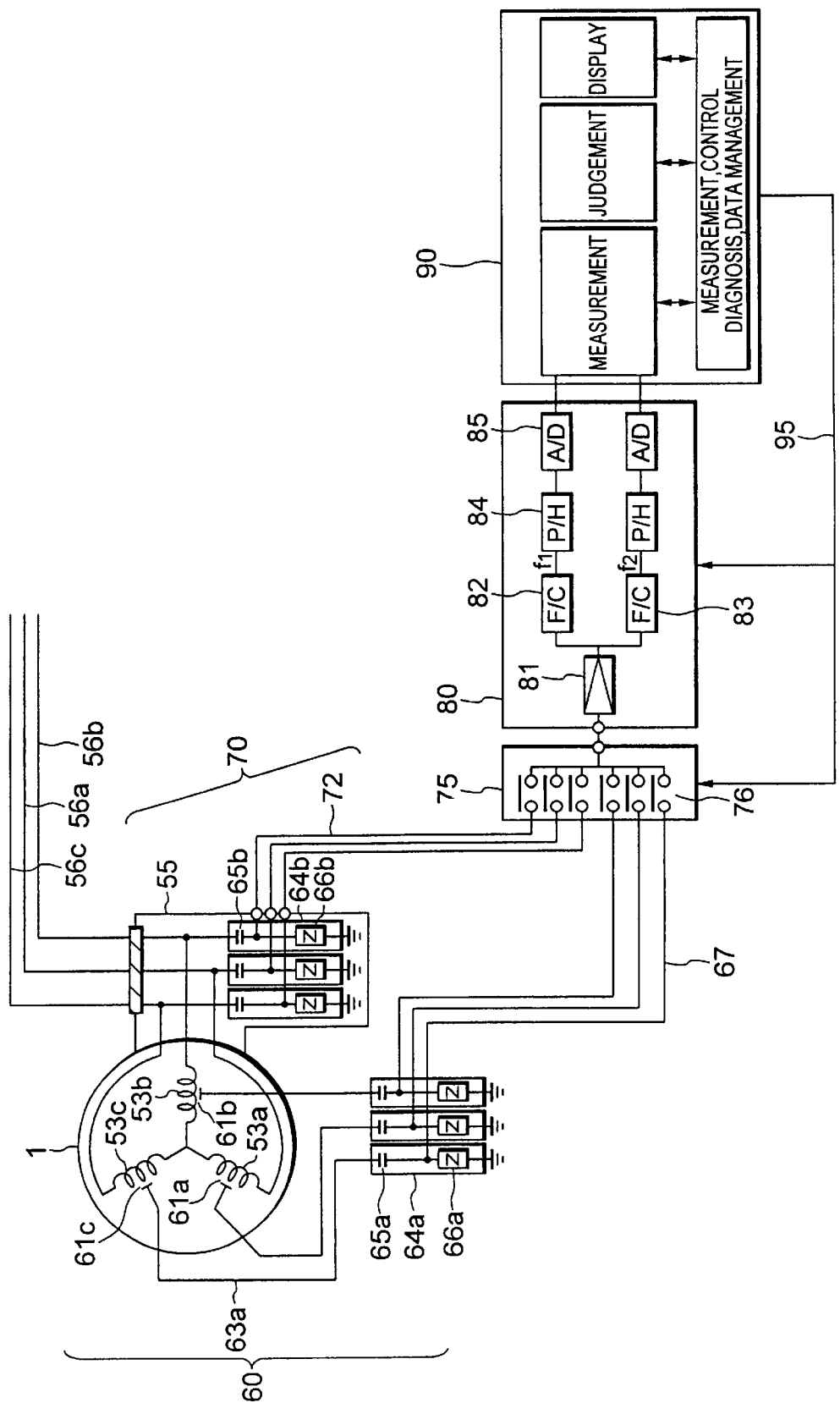
FIG. 1 is a view showing a structure of an abnormality detecting apparatus for a rotating electric machine according to a first embodiment of the invention.

FIG. 1 is a structural view schematically showing a structure of an abnormality detecting apparatus for a rotating electric machine according to a first embodiment of the invention. In this first embodiment, reference will be made, as an example, to a case where the invention is applied to a high-voltage electric motor 1 as a rotating electric machine. In FIG. 1, in the electric motor 1, stator windings 53a, 53b and 53c are generally inserted in slot grooves of stator iron cores (not shown) in a frame, are guided into a terminal box 55 set outside of the frame through lead wires, and are connected to high voltage buses 56. In a power plant, a plurality of electric motors 51, such as other electric motors (not shown), are connected in parallel with this high voltage buses 56 so as to be operated.

An abnormality detecting apparatus is constituted by a first partial discharge detector 60 or a second partial discharge detector 70, a switching unit 75, a partial discharge measurement element 80, a computer 90, and a controller 95. Hereinafter, each of these structural elements will be described in detail.

The first partial discharge detector 60 is constituted by partial discharge sensors 61a, 61b, and 61c provided adjacent the stator windings 53a, 53b and 53c, sensor leads extending from the partial discharge sensors 61a, 61b and 61c and provided inside of the frame, a signal cable 63a connected to each of the sensor leads and provided outside of the frame, a detection portion 64a, and a signal cable 67b for transmitting a signal from the detection portion 64a to the switching unit 75. The detection portion 64a is constituted by a capacitor 65a and a detection element 66a. The signal cable 63a is connected to the capacitor 65a, is further connected to the detection element 66a from the capacitor 65a, and is grounded. The signal cable 67 is connected from the coupling capacitor 65a at the side of the detection element 66a to a contact circuit 76 of the switching unit 75.

The second partial discharge detector 70 is constituted by a detection portion 64b connected to the lead wire in the inside of the terminal box 55, and a signal cable 72 for guiding a signal from the detection portion 64b to the switching unit 75. The detection portion 64b is constituted by a capacitor 65b and a detection element 66b, and the lead wire connected to the capacitor 65b is further connected to the detection element 66b through the capacitor 65b and is grounded. The signal cable 72 is connected from the coupling capacitor 65b at the side of the detection element 66b to the contact circuit 76 of the switching unit 75. If either one of the first partial discharge detectors 60 and the second partial discharge detectors 70 is provided, the object of the invention can be achieved. Of course, both may be provided.

The switching unit 75 arbitrarily selects signals from the first partial discharge detectors 60 and the second partial discharge detectors 70 on the basis of an instruction from the computer 90, and is constituted by a number of contact circuits 76.

The partial discharge measurement element 80 is constituted by an amplification/attenuation unit 81, a first filter circuit 82, a second filter circuit 83, a peak hold circuit 84, and an analog/digital converter 85. The first filter circuit 82 and the second filter circuit 83 are structured such that the center frequency and band width can be changed. The computer 90 is constituted by software (not shown) of a measurement condition, a noise rejection condition, an abnormality judgement standard, a method of measurement result display, control of the switching unit 75 and the partial discharge measurement element 80, and the like for each of the partial discharge detectors, and the controller 95 for carrying out control and measurement.

Next, the operation of the abnormality detecting apparatus of the rotating electric machine according to the first embodiment will be described with reference to FIG. 1.

In an electric apparatus such as a high voltage rotating electric machine, when insulation deterioration or insulation abnormality of the stator windings 53a, 53b, and 53c occurs, the partial discharge is generated at the stator windings 53a, 53b and 53c by a high voltage electric charge during the operation. With the generation of the partial discharge, a pulse-like high frequency current is induced in the stator windings 53a, 53b and 53c, and propagated through the stator windings 53a, 53b and 53c to be flown to the high voltage buses through the lead wires 54a, 54b and 54c. During this process, the partial discharge is detected in the first partial discharge detectors 60 or the second partial discharge detectors 70. The partial discharge is a high speed phenomenon of several nano seconds, and a pulse-like high frequency current accompanying the generation of the discharge has a frequency band to several GHz in the vicinity of generation of the discharge. However, attenuation occurs in a process in which the current is propagated through the stator windings 53a, 53b and 53c to reach the first partial discharge detectors 60 or the second partial discharge detectors 70. Although the attenuation is different according to the structure of the electric motor 1 or the structure of the stator windings 53a, 53b and 53c, a high frequency signal has large attenuation, and as the frequency becomes low, the attenuation becomes small. Although it is different according to the partial discharge sensor 61 or the coupling capacitor 65b for detection, in the embodiment of FIG. 1, design is made such that a signal in the range of several MHz to several tens MHz is detected.

On the other hand, during the operation of the electric motor 1, as described above, a number of pulse-like noises are generated, and the noises enter the electric motor 1 through the high voltage buses 56, and are propagated to the stator windings 53a, 53b and 53c. During this process, the noises are detected in the first partial discharge detectors 60 or the second partial discharge detectors 70.

Detected signals including the partial discharge and the noises are transmitted to the partial discharge detection circuit 80. In the partial discharge detection circuit 80, the signal is adjusted to have an optimum signal level for detection by the amplification/attenuation unit 81, and is divided and inputted to the first filter circuit 82 and the second filter circuit 83. The first filter circuit 82 and the second filter circuit 83 are narrow band band-pass filters of frequencies different from each other.

It has been clarified as a result of our researches that the partial discharge and the noise have different features in frequency characteristics. The frequency characteristics are also different between the first partial discharge detectors 60 and the second partial discharge detectors 70. Besides, the optimum detection frequency is also different among the partial discharge sensors of the first partial discharge detectors 60. Thus, the measurement frequencies of the first filter circuit 82 and the second filter circuit 83 are different between the first partial discharge detectors 60 and the second partial discharge detectors 70 of each electric motor 1. The optimum measurement frequency of each of the detectors is registered in the computer 90 in advance.

Here, the computer 90 is programmed so that a measurement frequency optimum for the partial discharge sensor selected by controlling the switching unit 75 from the computer is selected among the previously registered frequencies and measurement is made. The combination of detection No., detectors, and detection frequency in this embodiment is as shown in Table 1. Now, in the case where the V-phase partial discharge is detected by using the second partial discharge detectors of the electric motor A, when the detection No. 5 is selected, this sensor is selected by the switching unit 75, the detection frequency of the first filter is set to 14 MHz and the detection frequency of the second filter is set to 20 MHz by the control from the computer 90, and the measurement is made. Since the optimum measurement frequencies of the first filter circuit 82 and the second filter circuit 83 are different according to the objective electric motor 1, the frequencies are adjusted and registered when the apparatus of the invention is set first.

With respect to the narrow band signals having passed through the first filter circuit 82 and the second filter circuit 83, the peak of each of the signals is detected by the peak hold circuit 84, is digital converted by the analog/digital converter 85, and is stored in the computer 90. In the computer 90, the partial discharge and noise are discriminated by the noise rejection software to reject the noise, and the partial discharge is stored as a measurement result. The measurement result is compared with the previously registered abnormality judgement standard, and the judgement result is displayed. Further, since the measurement by the apparatus of the invention is also used for grasping aging over several years, the data are collected and managed for a long term for each sensor of each electric motor, and the aging characteristics of the objective electric motor is displayed. Data management for this is carried out.

Likewise, the computer 90 carries out the control of the switching unit of the apparatus of the invention, signal level control, frequency setting control, measurement/control of input of digital data or the like, noise rejection, judgement, abnormality diagnosis, management of measurement data, result display, and the like.

Embodiment 2

Figure 2:
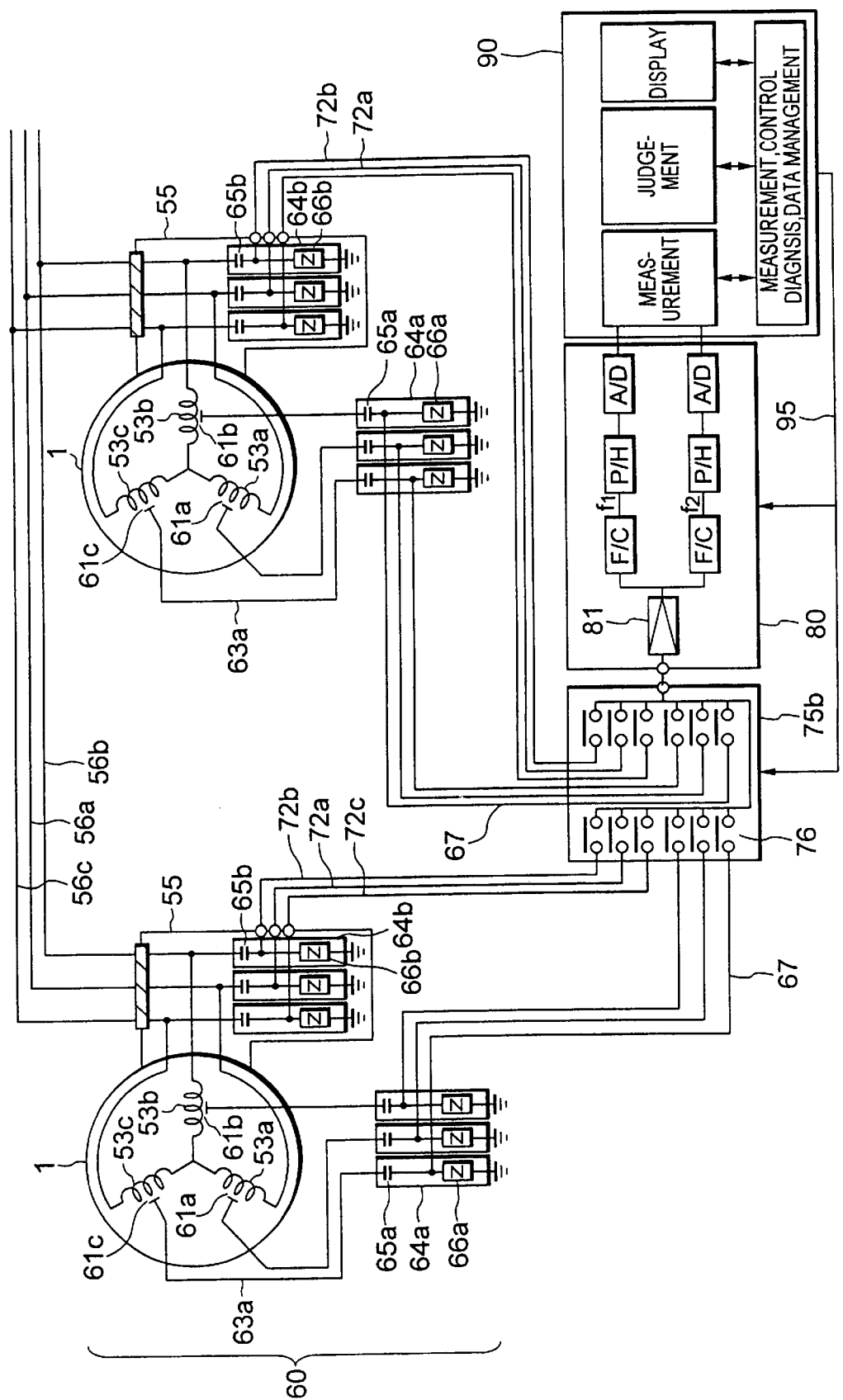
FIG. 2 is a view showing a structure of an abnormality detecting apparatus for a rotating electric machine according to a second embodiment of the invention.

FIG. 2 is a structural view schematically showing an abnormality detecting apparatus for a rotating electric machine according to a second embodiment of the invention. In a place such as a power plant where a high voltage electric motor is operated, a plurality of electric motors are often operated at the same time. In such a place, there is a strong demand that a single abnormality detecting apparatus makes abnormality monitoring of a plurality of electric motors 1. The second embodiment meets such a demand, and abnormality of a plurality of electric motors 1 is detected by one switching unit 75*b*, a partial discharge measurement 80, and a computer 90.

Hereinafter, the structure of the second embodiment will be described with reference to FIG. 2. The structure of the electric motor 1, a first partial discharge detector 60, a second partial discharge detector 70, a partial discharge measurement element 80, and a computer 90 are the same as the first embodiment. The number of input terminals of the switching unit 75*b* is increased so that the respective sensor signals of the plurality of electric motors 1 can be selected. The software or program executed by the computer 90 is made to meet the specification for selection, measurement, judgement, display and data management of the plurality of partial discharge detectors 80.

Next, the operation of the abnormality detecting apparatus of the rotating electric machine according to the second embodiment will be described with reference to FIG. 2.

A tester first determines a measurement objective electric motor 1, a measurement objective partial discharge detector 80, and a measurement objective partial discharge sensor. When key input to the computer 90 is performed in accordance with the determination, instructions are issued from the computer 90 to the switching unit 75*b* through the controller 95, so that only a corresponding contact is closed and a measurement objective sensor signal is transmitted to the partial discharge measurement element 80. The operation of the partial discharge measurement element 80 is the same as the first embodiment 1. For example, as shown in Table 2, according to the combination of the objective electric motor, detectors, partial discharge sensor, and first and second filter detection frequencies, the computer 90 is provided with measurement control/noise rejection software for carrying out selection of a contact of the switching unit 75*b*, control of amplification/attenuation unit 81, control of detection frequencies of the first and second filter circuits, signal distinction through a noise rejection constant and noise rejection.

Since the plurality of electric motors 1 are made measurement objects, the measurement conditions, noise discrimination conditions and data management conditions for the respective partial discharge sensors naturally become numerous. The software meets these conditions.

In the computer 90, the partial discharge is discriminated from noise by the noise rejection software to reject the noise, and the partial discharge is stored as the measurement result. The measurement result is compared with the previously stored abnormality judgement standard, and the judgement result is displayed. Further, since the measurement by the apparatus of the invention is also used for grasping aging over several years, the data are collected and managed for a long term for each sensor of each electric motor, and the aging characteristics of the objective electric motor are displayed. Data management for this is carried out.

Although FIG. 2 shows the structure for measuring the partial discharge of two electric motors 1, it is obvious that even if the number of the electric motors 1 is increased to three or four, it is possible to cope with the situation by increasing the number of terminals of the switching unit 75*b* and changing the software.

Embodiment 3

Figure 3:
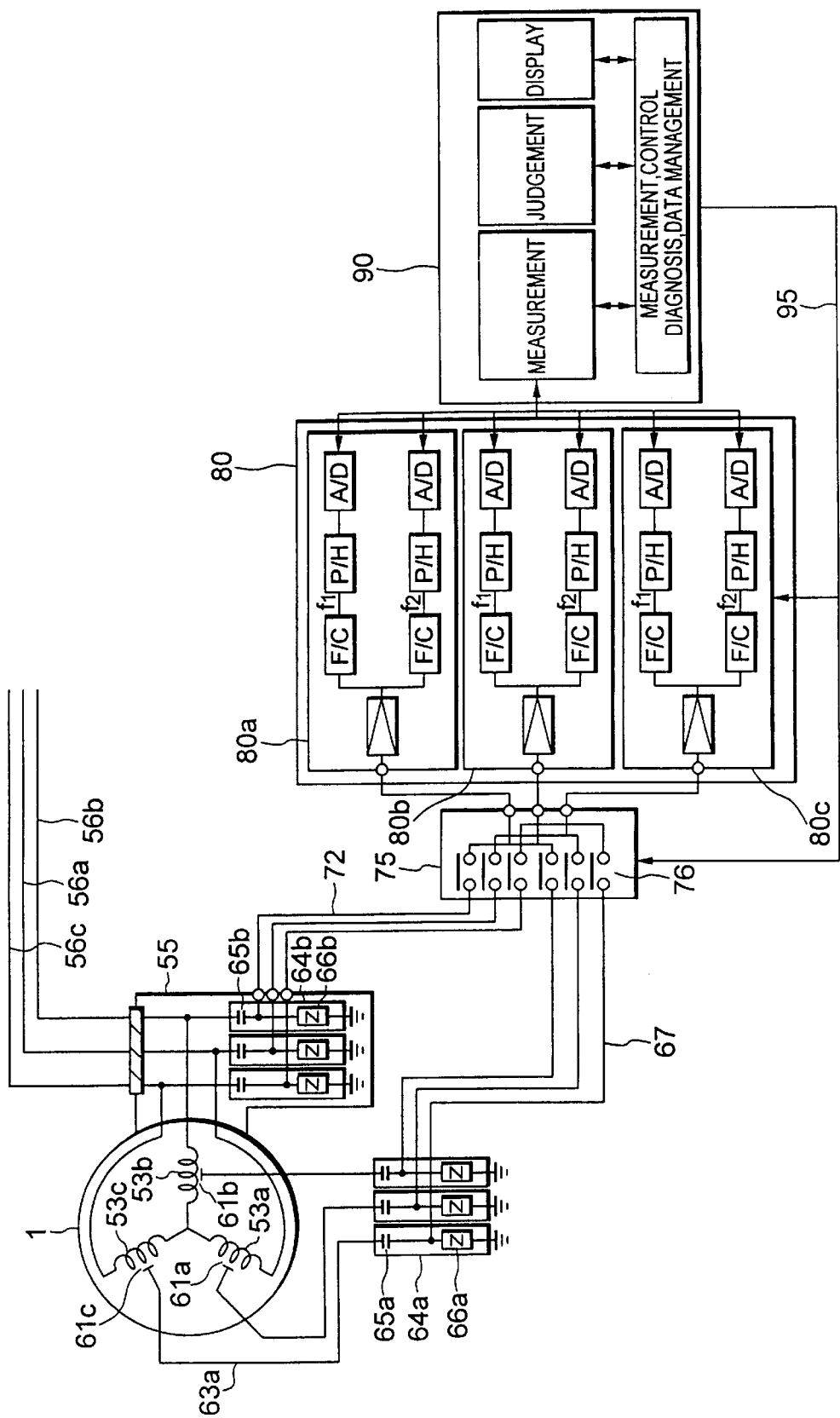
FIG. 3 is a view showing a structure of an abnormality detecting apparatus for a rotating electric machine according to a third embodiment of the invention.

FIG. 3 is a structural view schematically showing a structure of an abnormality detecting apparatus for a rotating electric machine according to a third embodiment of the invention. In continuous monitoring of stator windings 53 of an electric motor 1, if three phases can be monitored at the same time, the accuracy of diagnosis is improved. Besides, if a signal detected by a first partial discharge detector 60 is compared with a signal detected by a second partial discharge detector 70, discrimination between the noise and partial discharge can be advanced. The third embodiment meets these requirements.

The structure of the third embodiment will be described with reference to FIG. 3. In FIG. 3, an electric motor 1, a first partial discharge detector 60, and a second partial discharge detector 70 respectively have the same structure as the first embodiment. Also in the third embodiment, either one of the first partial discharge detectors 60 and the second partial discharge detectors 70 has only to be provided. A switching unit 75c has such a contact arrangement structure that signals of partial discharge sensors provided at three phases of U, V and W can be measured at the same time. A partial discharge measurement element 80 is constituted by three elements comprising a partial discharge measurement element 80a for measuring a partial discharge of the U phase, a partial discharge measurement element 80b for measuring a partial discharge of the V phase, and a partial discharge measurement element 80c for measuring a partial discharge of the W phase. The structure of the respective partial discharge measurement elements 80a, 80b, and 80c is the same as that of the first embodiment. A computer 90 is also the same as the first embodiment. A controller 95 controls the switching unit 75c and the partial discharge measurement elements 80a, 80b, and 80c from the computer 90.

Next, the operation of the abnormality detecting apparatus of the rotating electric machine according to the third embodiment will be described with reference to FIG. 3. The first partial discharge detector 60 and the second partial discharge detector 70 detect partial discharge pulses and noise pulses, and the detection signals are transmitted to the switching unit 75c through a signal cable 67. The operation until here is the same as the first embodiment. Here, when a partial discharge is generated at a certain place of the stator winding 53, a high frequency signal caused from the generation of the partial discharge is detected by any of partial discharge sensors 61a, 61b and 61c. At this time, according to the place of the generation of the signal, the detection intensity varies among the partial discharge sensors 61a, 61b and 61c. In the first and second embodiments, although a signal from one partial discharge sensor is detected, in the third embodiment, signals of the three partial discharge sensors 61a, 61b and 61c of the first partial discharge detector 60 are detected at the same time. In the partial discharge measurement element 80, the partial discharge of the U phase is measured by using the partial discharge detector 80a, the partial discharge of the V phase is detected by using the partial discharge detector 80b, and the partial discharge of the W phase is measured by using the partial discharge detector 80c, and measurement results are transmitted to the computer 90. That is, the same pulse is detected by the three sensors and is recorded in the computer 90. The computer 90 discriminates the partial discharge from the noise as described in the first embodiment, and displays the partial discharge of the U, V and W phases at the same time, and further, from trend management and measurement result comparison for each phase, the computer makes such judgement that insulation deterioration of which phase is most severe.

In the same way, a contact circuit of the switching unit 75C is connected so that a signal from the second partial discharge detector 70 is measured, and the partial discharge of the U, V and W phases can be measured. The processing subsequent to the measurement of the partial discharge using the second partial discharge detector 70 is the same as the case where the first partial discharge detector 60 is used.

In the third embodiment, although the description has been made on the structure in which the partial discharge of one electric motor is measured, it is needless to say that the partial discharge of a plurality of electric motors can be measured by increasing the contact circuits of the switching unit 75C.

Embodiment 4

Figure 4:
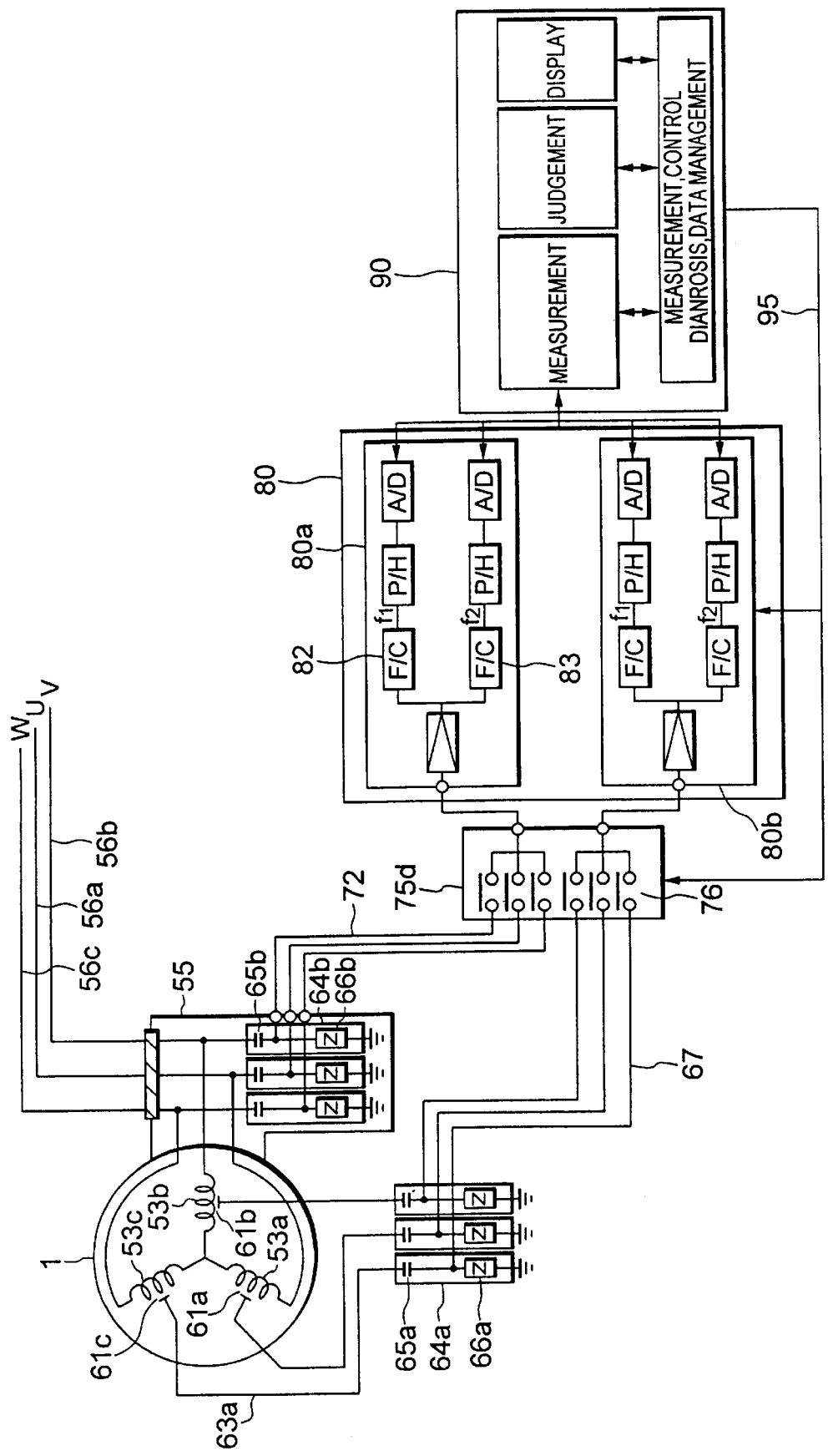
FIG. 4 is a view showing a structure of an abnormality detecting apparatus for a rotating electric machine according to a fourth embodiment of the invention.
Figure 7:
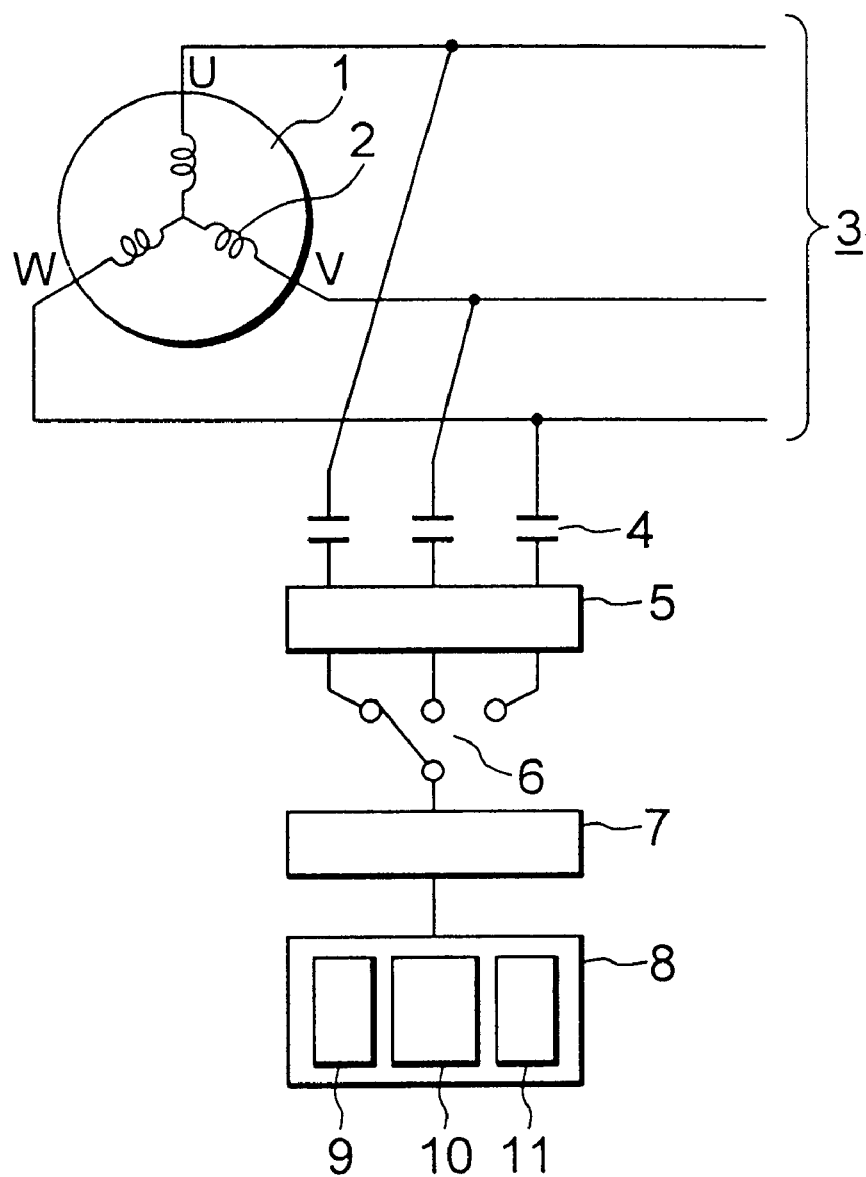
FIG. 7 is a view showing a structure of a conventional abnormality detecting apparatus for a rotating electric machine.
Figure 8:
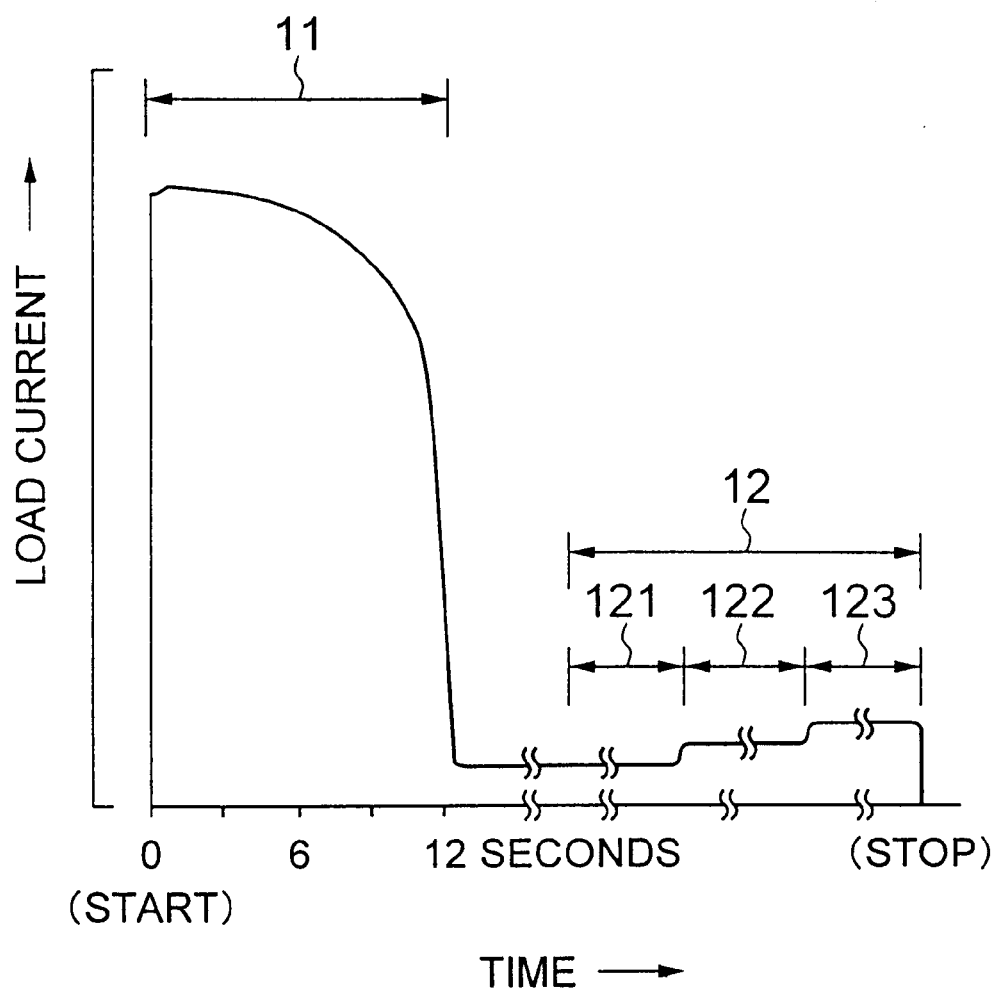
FIG. 8 is a view for explaining the operation of the conventional abnormality detecting apparatus of the rotating electric machine.
Figure 9:
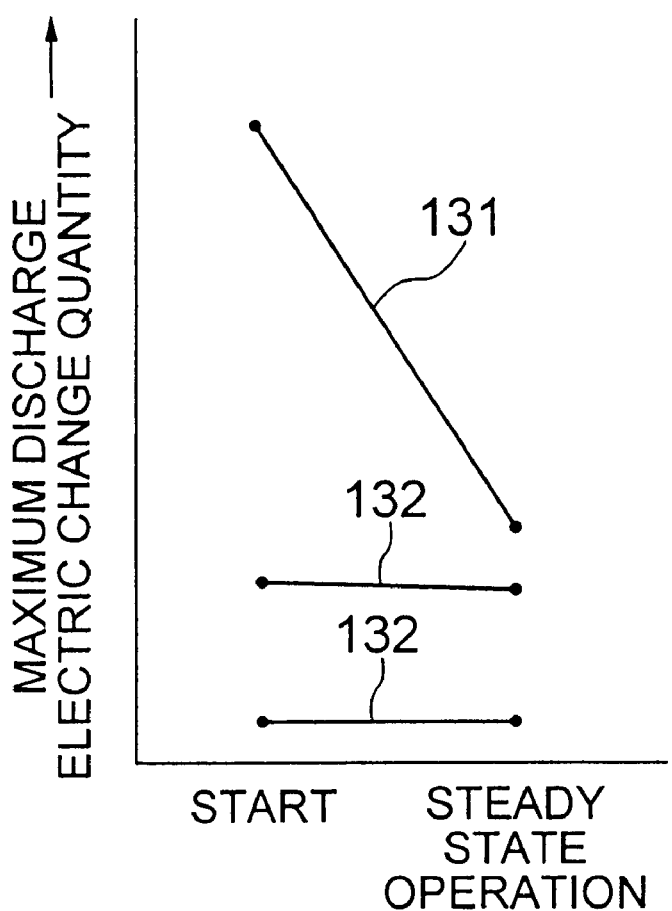
FIG. 9 is a view for explaining the operation of the conventional abnormality detecting apparatus of the rotating electric machine.

FIG. 4 is a structural view schematically showing a structure of an abnormality detecting apparatus for a rotating electric machine according to a fourth embodiment of the invention. During the operation of an electric motor 1, as described in the first embodiment, a number of noise pulses enter the electric motor 1 through a high voltage buses 56. The fourth embodiment is provided to discriminate the noises.

The structure of the fourth embodiment will be described with reference to FIG. 4. In FIG. 4, the electric motor 1, a first partial discharge detector 60, and a second partial discharge detector 70 respectively have the same structure as the first embodiment. In the fourth embodiment, both the first partial discharge detector 60 and the second partial discharge detector 70 are provided. A contact circuit of a switching unit 75d has such a structure that signals of a detection portion 64a of the first partial discharge detector 60 and a detection portion 64b of the second partial discharge detector 70 provided in a U phase are respectively selected and are transmitted to a partial discharge measurement element 80. The partial discharge measurement element 80 is constituted by a first partial discharge measurement element 80a for detecting a signal from the first partial discharge detector 60, and a second partial discharge measurement element 80b for detecting a signal from the second partial discharge detector 70. The circuit structure of the first partial discharge measurement element 80a and the second partial discharge measurement element 80b is the same as the partial discharge measurement element 80 of the first embodiment. The basic structure of a computer 90 is also the same as the first embodiment. A controller 95 is used for controlling the switching unit 75d and the first and second partial discharge measurement elements 80a and 80b from the computer 90.

Next, the operation of the fourth embodiment will be described. When a detection instruction of either one of U, v and W phases is issued from the computer, for example, now, when a measurement instruction of the U phase is issued, in the switching unit 75d, the contact circuit is set through the controller 95 in such a manner that the signal of the detection portion 64a of the first partial discharge detector 60 provided in the U phase and the signal of the detection portion 64b of the second partial discharge detector 70 provided in the U phase are detected. In the partial discharge measurement element 80, measurement frequencies of the first filter circuit 82 and the second filter circuit 83 are set for each of the first partial discharge detector 60 and the second partial discharge detector 70. As described above, the measurement frequencies of the first filter circuit 82 and the second filter circuit 83 are different for each of the first partial discharge detector 60 and the second partial discharge detector 70 of the electric motor 1. The optimum measurement frequencies of the respective detectors are registered in the computer 90 in advance. Here, the computer 90 is programmed so that the optimum measurement frequency for the partial discharge sensor, which is selected by controlling the switching unit 75d from the computer, among the previously registered frequencies and measurement is made.

When a partial discharge is generated at a certain place of the U-phase stator winding 53a, a high frequency signal caused from the generation of the partial discharge is first detected by the partial discharge sensor 61a set in the U phase. Thereafter, after a definite time has elapsed, a signal is propagated through the lead wire 54a and is detected through the coupling capacitor 65b. On the other hand, as described above, a noise is propagated into the electric motor 1 through the high voltage buses 65. Thus, first, a signal is detected through the coupling capacitor 65b provided in the U-phase lead wire. Thereafter, after a definite time has elapsed, a signal is detected by the partial discharge sensor 61a set in the U phase. By using the time difference detected by the two sensors, the partial discharge is discriminated from the noise, and only the partial discharge is detected.

In the same manner, the signal contact is switched by the switching unit 75d, and the partial discharge of the V phase and W phase is measured. In the fourth embodiment, although the description has been made on the structure in which the partial discharge of one electric motor is measured, it is needless to say that the partial discharge of a plurality of electric motors can be measured by increasing the contact circuits of the switching unit 75d.

Besides, in the fourth embodiment, although the description has been made on the structure in which the noise is discriminated by a difference in reaching time to the first partial discharge detector 60 and the second partial discharge detector 70, by using the difference of propagation characteristics of the partial discharge and the noise, the noise can be discriminated by comparing the signal intensity of the same pulse detected in 100 nano seconds by the first partial discharge detector 60 and the second partial discharge detector 70. In this case, the signal intensity of the first partial discharge detector 60 is compared with that of the second partial discharge detector 70, and it can be discriminated that the pulse is the partial discharge generated in the stator winding 53 of the rotating electric machine 1 when the signal of the first partial discharge detector 60 is larger, and the pulse is the noise entered from the outside when the signal of the second partial discharge detector 70 is larger.

As described above, an abnormality detecting apparatus according to one aspect of the present invention comprises a plurality of partial discharge detectors for detecting a partial discharge of a rotating electric machine; a switching unit for selecting one arbitrary signal from the plurality of partial discharge detectors; a partial discharge measurement element for measuring a signal of the selected partial discharge detector; a computer for arbitrarily selecting one of the plurality of partial discharge detectors or sequentially selecting the plurality of partial discharge detectors, for carrying out measurement, noise rejection, insulation diagnosis judgement, and data management for the respective partial discharge detectors in accordance with a measurement condition, a judgement condition, and a management condition previously determined for the respective partial discharge detectors, and for displaying a measurement result; and a controller for controlling the switching unit and the partial discharge measurement element from the computer. With this arrangement, a small, lightweight and portable apparatus can be provided at low cost.

Besides, an abnormality detecting apparatus according to another aspect of the present invention comprises a plurality of partial discharge detectors for detecting a partial discharge of a rotating electric machine; a switching unit for selecting three arbitrary signals from the plurality of partial discharge detectors; a partial discharge measurement element for measuring the selected three signals of the partial discharge detectors; a computer for arbitrarily selecting three of the plurality of partial discharge detectors or sequentially selecting three of the plurality of partial discharge detectors, for carrying out measurement, noise rejection, insulation diagnosis judgement, and data management for respective partial discharge detectors in accordance with a measurement condition, a judgement condition, and a management condition previously determined for the respective partial discharge detectors, and for displaying a measurement result; and a controller for controlling the switching unit and the partial discharge measurement element from the computer. With this arrangement, a small, lightweight and portable apparatus capable of measuring a partial discharge of three phases can be provided at low cost.

Moreover, an abnormality detecting apparatus according to a further aspect of the invention comprises a plurality of first partial discharge detectors set inside of frames of a plurality of rotating electric machines; a plurality of second partial discharge detectors set at high voltage buses of the plurality of rotating electric machines; a switching unit for selecting one arbitrary signal from the plurality of first partial discharge detectors and one arbitrary signal from the plurality of second partial discharge detectors; a partial discharge measurement element for measuring the selected signals of the first and second partial discharge detectors; a computer for arbitrarily selecting one of the plurality of first partial discharge detectors and one of the plurality of second partial discharge detectors or sequentially selecting the first partial discharge detectors and the second partial discharge detectors, for carrying out measurement, noise rejection, insulation diagnosis judgement, and data management for the first partial discharge detectors and for the second partial discharge detectors in accordance with a measurement condition, a judgement condition, and a management condition previously determined for the first partial discharge detectors and those for the second partial discharge detectors, and for displaying measurement results; and a controller for controlling the switching unit and the partial discharge measurement element from the computer. With this arrangement, a small, lightweight, and portable apparatus can be provided at low cost.

Preferably, according to the invention, the partial discharge measurement element comprises a first narrow band detection circuit and a second narrow band detection circuit in which propagation characteristics of a signal is taken into consideration, so that the partial discharge is discriminated from noise through a comparison between a first narrow band signal and a second narrow band signal, Thus, only a partial discharge can be measured with high accuracy.

Preferably, according to the invention, a detection band of the first narrow band detection circuit and the second narrow band detection circuit is 5 to 50 MHz, and the partial discharge is discriminated from noise by a signal intensity comparison between the first narrow band signal and the second narrow band signal. Accordingly, only a partial discharge can be measured with high accuracy.

Preferably, according to the invention, the plurality of partial discharge detectors set inside of the frame of the rotating electric machine are temperature detectors and lead lines. Thus, it is not necessary to newly set sensors, and abnormality can be detected at low cost without lowering the reliability of the rotating electric machine.

Preferably, according to the invention, the plurality of partial discharge detectors set inside of the frame of the rotating electric machine are antennas, the center frequency of an electromagnetic wave detected by the first narrow band detection circuit and the second narrow band detection circuit is within a range of 300 MHz to 3 GHz, and the partial discharge is discriminated from the noise by signal intensity comparison between the first narrow band signal and the second narrow band signal. With this arrangement, only a partial discharge can be measured with high accuracy.

Preferably, according to the invention, the plurality of partial discharge detectors set at lead wires for driving the rotating electric machine are coupling capacitors and detection elements. Thus, the partial discharge detectors can be provided at low cost.

Moreover, according to the invention, in accordance with previously programmed contents, each of the partial discharge detectors is arbitrarily selected, so that the partial discharge is measured in a measurement frequency band set for each of the partial discharge detectors, so that a partial discharge is discriminated by a comparison between the first narrow band signal and the second narrow band signal for each of the partial discharge detectors to reject the noise, and thereafter insulation diagnosis judgement is made, and data management is made for each of partial discharge measurement portions. Accordingly, electric power can be saved, and abnormality monitoring can be made at low cost.

Preferably, according to the invention, the noise can be discriminated from the partial discharge by a difference in reaching time to the first partial discharge detectors and the second partial discharge detectors. Accordingly, a partial discharge can be measured with high accuracy.

Preferably, according to the invention, noise can be discriminated from a partial discharge by comparing the output signal intensity of the first partial discharge detectors with the output signal intensity of the second partial discharge detectors. Thus, a partial discharge can be measured with high accuracy.

What is claimed is:

1. An abnormality detecting apparatus for a rotating electric machine for measuring a partial discharge generated by an abnormality of the rotating electric machine, the apparatus comprising:

a plurality of partial discharge detectors operatively connected to a rotating electric machine for detecting a partial discharge of the rotating electric machine;

a switching unit operatively connected to the partial discharge detectors for selecting one of the plurality of partial discharge detectors;

a partial discharge measurement element for measuring a signal of the partial discharge detector selected by the switching unit;

a computer for selecting one of the plurality of partial discharge detectors or sequentially selecting the plurality of partial discharge detectors, for analyzing the signals produced by the respective partial discharge detectors; and control means operatively connected to the switching unit, the partial discharge measurement element, and the computer for controlling the switching unit and the partial discharge measurement element through the computer.

2. The abnormality detecting apparatus for a rotating electric machine according to claim 1, wherein the plurality of partial discharge detectors comprises a plurality of first partial discharge detectors located inside of a frame of the rotating electric machine.

3. The abnormality detecting apparatus for a rotating electric machine according to claim 1, wherein the plurality of partial discharge detectors comprises a plurality of first partial discharge detectors located at high voltage buses of the rotating electric machine.

4. The abnormality detecting apparatus for a rotating electric machine according to claim 1, wherein the partial discharge measurement element comprises a first narrow band detection circuit and second narrow band detection circuit, and the partial discharge is detected and measured by a comparison between a first narrow band signal and a second narrow band signal.

5. An abnormality detecting apparatus for a rotating electric machine for measuring a partial discharge generated by an abnormality of the rotating electric machine, the apparatus comprising:

a plurality of partial discharge detectors operatively connected to a rotating electric machine for detecting a partial discharge of the rotating electric machine;

a switching unit operatively connected to the partial discharge detectors for selecting three of the plurality of partial discharge detectors;

a partial discharge measurement element for measuring signals produced by the three partial discharge detectors selected by the switching unit;

a computer for selecting three of the plurality of partial discharge detectors or sequentially selecting three of the plurality of partial discharge detectors, for analyzing the signals produced by the respective partial discharge detectors; and control means operatively connected to the switching unit, the partial discharge measurement element, and the computer for controlling the switching unit and the partial discharge measurement element through the computer.

6. The abnormality detecting apparatus for a rotating electric machine according to claim 5, wherein the plurality of partial discharge detectors comprises a plurality of first partial discharge detectors located inside of a frame of the rotating electric machine.

7. The abnormality detecting apparatus for a rotating electric machine according to claim 5, wherein the plurality of partial discharge detectors comprises a plurality of first partial discharge detectors located at high voltage buses of the rotating electric machine.

8. The abnormality detecting apparatus for a rotating electric machine according to claim 5, wherein the partial discharge measurement element comprises a first narrow band detection circuit and second narrow band detection circuit, and the partial discharge is detected and measured by a comparison between a first narrow band signal and a second narrow band signal.

9. An abnormality detecting apparatus for a plurality of rotating electric machines for measuring a partial discharge generated by an abnormality of the rotating electric machines, the apparatus comprising:

a plurality of first partial discharge detectors operatively connected to a plurality of rotating electric machines and located inside of frames of the plurality of rotating electric machines;

a plurality of second partial discharge detectors operatively connected to the plurality of rotating electric machines and located at high voltage buses of the plurality of rotating electric machines;

a switching unit operatively connected to the first and second partial discharge detectors for selecting one of the plurality of first partial discharge detectors and one of the plurality of second partial discharge detectors;

a partial discharge measurement element for measuring a signal of the signals of the first and second partial discharge detectors selected by the switching unit;

a computer for selecting one of the plurality of first partial discharge detectors and one of the plurality of second partial discharge detectors or sequentially selecting the plurality of first partial discharge detectors and the plurality of second partial discharge detectors, for analyzing the signals produced by the first partial discharge detectors and the second partial discharge detectors; and control means operatively connected to the switching unit, the partial discharge measurement element, and the computer for controlling the switching unit and the partial discharge measurement element through the computer.

10. The abnormality detecting apparatus for a plurality of rotating electric machines according to claim 9, wherein the partial discharge measurement element comprises a first narrow band detection circuit and a second narrow band detection circuit, and the partial discharge is detected and measured by a comparison between a first narrow band signal and a second narrow band signal.

11. The abnormality detecting apparatus for a plurality of rotating electric machines according to claim 10, wherein a detection band of the first narrow band detection circuit and of the second narrow band detection circuit is 5 to 50 MHz, and the comparison between the first narrow band signal and the second narrow band signal is a signal intensity comparison.

12. The abnormality detecting apparatus for a plurality of rotating electric machines according to claim 10, wherein the plurality of first partial discharge detectors located inside of the frames of the rotating electric machines include antennas, center frequency of an electromagnetic wave detected by the first narrow band detection circuit and the second narrow band detection circuit is within a range of 300 MHz to 3 GHz, and the comparison between the first narrow band signal and the second narrow band signal is a signal intensity comparison.

13. The abnormality detecting apparatus for a plurality of rotating electric machines according to claim 9, wherein the plurality of first partial discharge detectors located inside of the frames of the rotating electric machines include temperature detectors and lead lines.

14. The abnormality detecting apparatus for a plurality of rotating electric machines according to claim 9, wherein the plurality of second partial discharge detectors located at the high voltage buses of the rotating electric machines include coupling capacitors and detectors.

* * * * *